United States Patent
Kang et al.

(10) Patent No.: US 10,850,448 B2
(45) Date of Patent: Dec. 1, 2020

(54) THREE-DIMENSIONAL PRINTING SYSTEM

(71) Applicants: XYZPRINTING, INC., New Taipei (TW); KINPO ELECTRONICS, INC., New Taipei (TW)

(72) Inventors: Hung-Peng Kang, New Taipei (TW); Ming-Hsiung Ding, New Taipei (TW); Tsung-Hua Kuo, New Taipei (TW)

(73) Assignees: XYZPRINTING, INC., New Taipei (TW); KINPO ELECTRONICS, INC., New Taipei (TW)

( * ) Notice: Subject to any disclaimer, the term of this patent is extended or adjusted under 35 U.S.C. 154(b) by 43 days.

(21) Appl. No.: 16/027,551

(22) Filed: Jul. 5, 2018

(65) Prior Publication Data

US 2019/0322049 A1    Oct. 24, 2019

(30) Foreign Application Priority Data

Apr. 24, 2018    (CN) .......................... 2018 1 0372783

(51) Int. Cl.
*B29C 64/277*    (2017.01)
*B33Y 30/00*    (2015.01)
(Continued)

(52) U.S. Cl.
CPC .......... *B29C 64/277* (2017.08); *B29C 64/135* (2017.08); *B33Y 30/00* (2014.12); *B33Y 50/02* (2014.12); *G03F 7/70416* (2013.01)

(58) Field of Classification Search
CPC .................................................. B29C 64/255
See application file for complete search history.

(56) References Cited

U.S. PATENT DOCUMENTS

2014/0227382 A1    8/2014    Liska et al.
2014/0339741 A1    11/2014    Aghababaie et al.
(Continued)

FOREIGN PATENT DOCUMENTS

| DE | 102015103389 A1 | 9/2016 |
| EP | 1849587 A1 | 10/2007 |
| JP | 2012506063 A | 3/2012 |

OTHER PUBLICATIONS

Office Action dated Aug. 20, 2019 of the corresponding Japan patent application.
(Continued)

*Primary Examiner* — Jacob T Minskey
*Assistant Examiner* — Jennifer A Kessie
(74) *Attorney, Agent, or Firm* — Chun-Ming Shih; HDLS IPR Services

(57) ABSTRACT

A 3D printing system includes a tank filled with a liquid forming material; a platform movably disposed above the tank; a lighting module including a plurality of LEDs disposed below the tank and used for providing light projecting toward the liquid forming material, and a controlling module coupled to the lighting module and configured to drive the lighting module to generate light that is focused onto a focus plane between the platform and the tank and having a certain distance with the bottom of the tank for solidifying the liquid forming material on the focus plane to form a cross-sectional layer, wherein the controlling module uses the brightness of one of the LEDs as a basis for varying that of the other LEDs, so that the liquid forming material solidified in single (scanning) procedure can have approximately the same hardness.

5 Claims, 4 Drawing Sheets

(51) Int. Cl.
*B33Y 50/02* (2015.01)
*B29C 64/135* (2017.01)
*G03F 7/20* (2006.01)

(56) References Cited

U.S. PATENT DOCUMENTS

2016/0279876 A1* 9/2016 Truchsess ............... B33Y 30/00
2018/0020683 A1* 1/2018 Contractor ............. B33Y 10/00
                                                                426/231
2019/0084230 A1* 3/2019 Stadlmann ............ B29C 64/245

OTHER PUBLICATIONS

Search Report dated Jan. 3, 2019 of the corresponding European patent application.

* cited by examiner

THREE-DIMENSIONAL PRINTING SYSTEM

BACKGROUND

Technical Field

The present disclosure relates to a three-dimensional (3D) printing system and, more particularly, to a 3D printing system for providing light focused onto a focus plane to irradiate the liquid forming material to make the 3D object have similar hardness.

Description of Related Art

In general, additive manufacturing technology converts design information of a 3D model built by software such as computer-aided design (CAD) into a plurality of thin (quasi-two-dimensional) cross-sectional layers stacked continuously. At the same time, many technical means capable of forming a plurality of thin cross-sectional layers have also been gradually proposed. For instance, the printing module of a printing apparatus can generally move above the substrate along an XY-plane according to the spatial coordinates XYZ built by the design information of the 3D model, such that the building material can form a correct cross-sectional layer shape. The deposited building material can be subsequently cured in a natural manner or cured via heating or irradiation from a light source to form the needed cross-sectional layers. Therefore, since the printing module moves along an axis Z layer by layer, a plurality of cross-sectional layers can be stacked layer by layer along the axis Z. As a result, the building material can form a 3D structure when being cured layer by layer.

Stereolithography is widely used to form highly-defined components due to rapid, stability, and high precision. FIG. 1 illustrates a related art three-dimensional (3D) printing system. The 3D printing apparatus 1 is a stereo lithography apparatus (SLA) for building a 3D object 12. The printing module 14 is adapted to immerse into the liquid forming material 18 filled within a tank 16, and a lighting module 20 on the XY plane irradiates the liquid forming material 18, so that the liquid forming material 18 can be cured and stacked on a platform 140 of the printing module 14. As such, by moving the platform 140 of the printing module 14 along Z axis layer by layer, the liquid forming material 18 may layer by layer be cured and stacked to form the 3D object 12.

In the view of XY plane, however, the light provided by the lighting module 20 has a sector-shaped profile, which results in different hardness of the 3D object. Specifically, as shown in FIG. 2, the distances for the light travelling from the lighting module 20 to a forming surface S (between the platform 140 and a bottom of the tank 16) are different. For example, the distance from the light emitting point (the intersection of points A and B) to the point A (as the right side) is greater than that from the light emitting point to the point B, so that the liquid forming material 18 in different positions will be irradiated by the light with different brightness, then the liquid forming material 18 cured in each (scanning) procedure will have different hardness.

SUMMARY

In general, one innovation aspect of the subject matter described in this specification can be embodied in a three-dimensional (3D) printing system that includes a tank, a platform, a lighting module, and a controlling module. The tank is filled with a liquid forming material; the platform is movably disposed above the tank and adapted to immerse into the liquid forming material filler within the tank. The lighting module including a plurality of light emitting diodes (LEDs) is disposed below the tank and used for providing light projecting toward the liquid forming material. The controlling module is coupled to the lighting module and configured to drive the lighting module to generate light that is focused onto a focus plane between the platform and the tank and away from a bottom of the tank with a predetermined distance for irradiating the liquid material, so that the liquid forming material is cured to form a cross-sectional layer. The controlling module uses the brightness of one of the LEDs as a basis for varying the brightness of the other LEDs, so that the liquid forming material cured in each (scanning) procedure has similar hardness.

BRIEF DESCRIPTION OF DRAWING

The present disclosure can be more fully understood by reading the following detailed description of the embodiment, with reference made to the accompanying drawings as follows.

DETAILED DESCRIPTION

Figure 1:
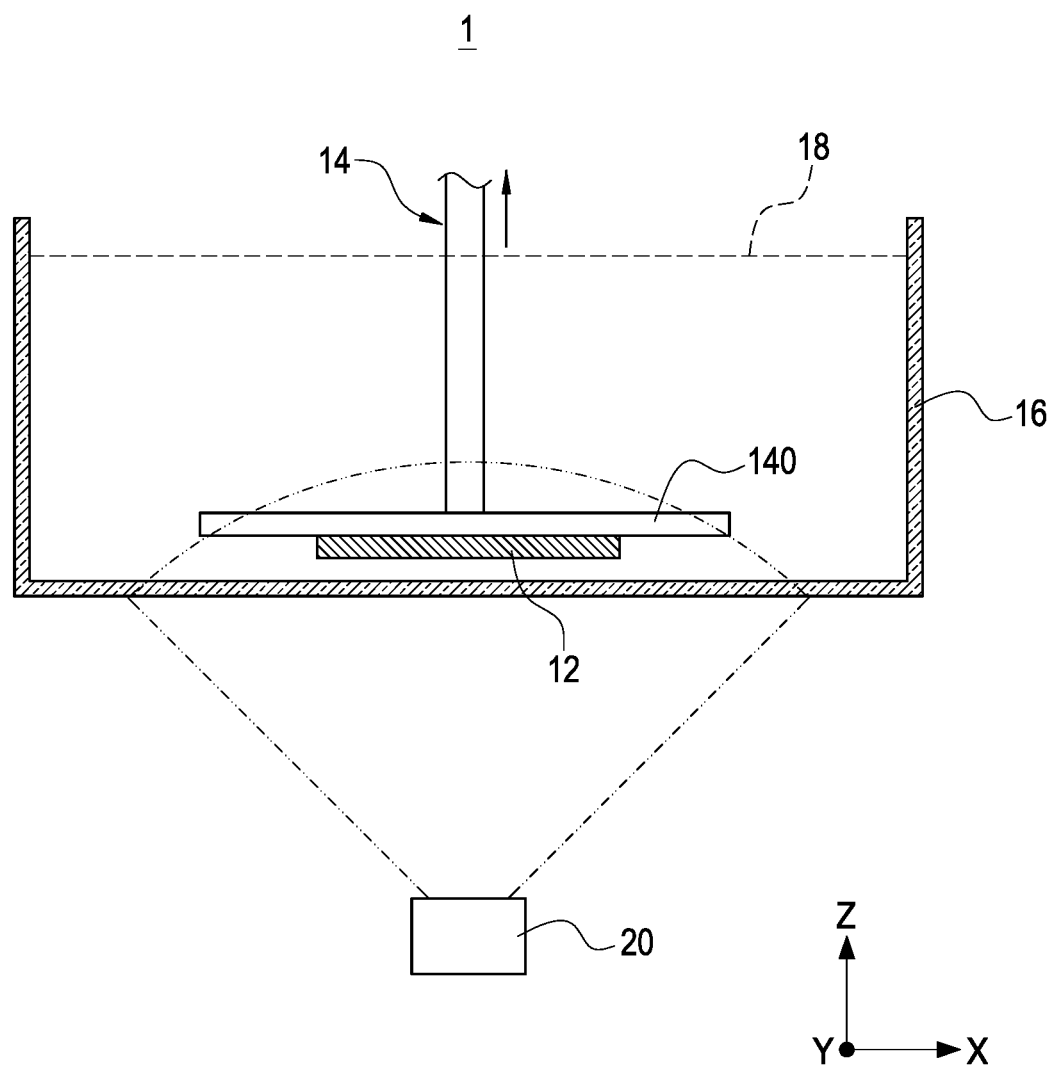
FIG. 1 illustrates a related art three-dimensional (3D) printing system.
Figure 2:
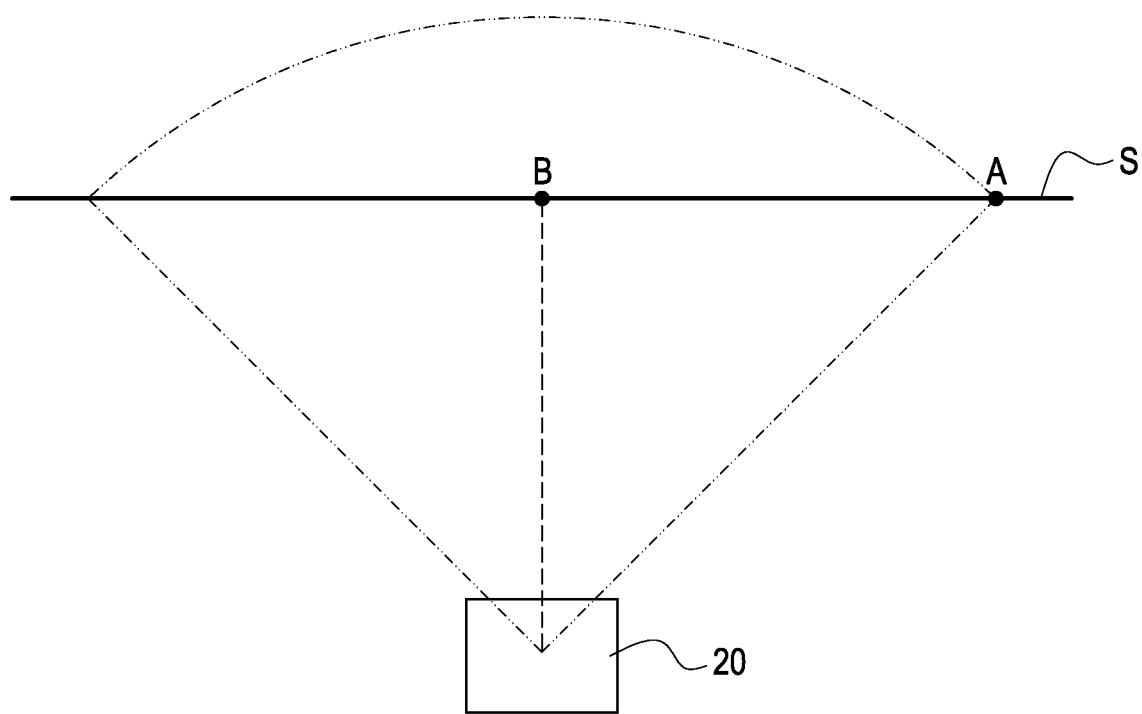
FIG. 2 depicts an optical path of the related art 3D printing system.
Figure 3:
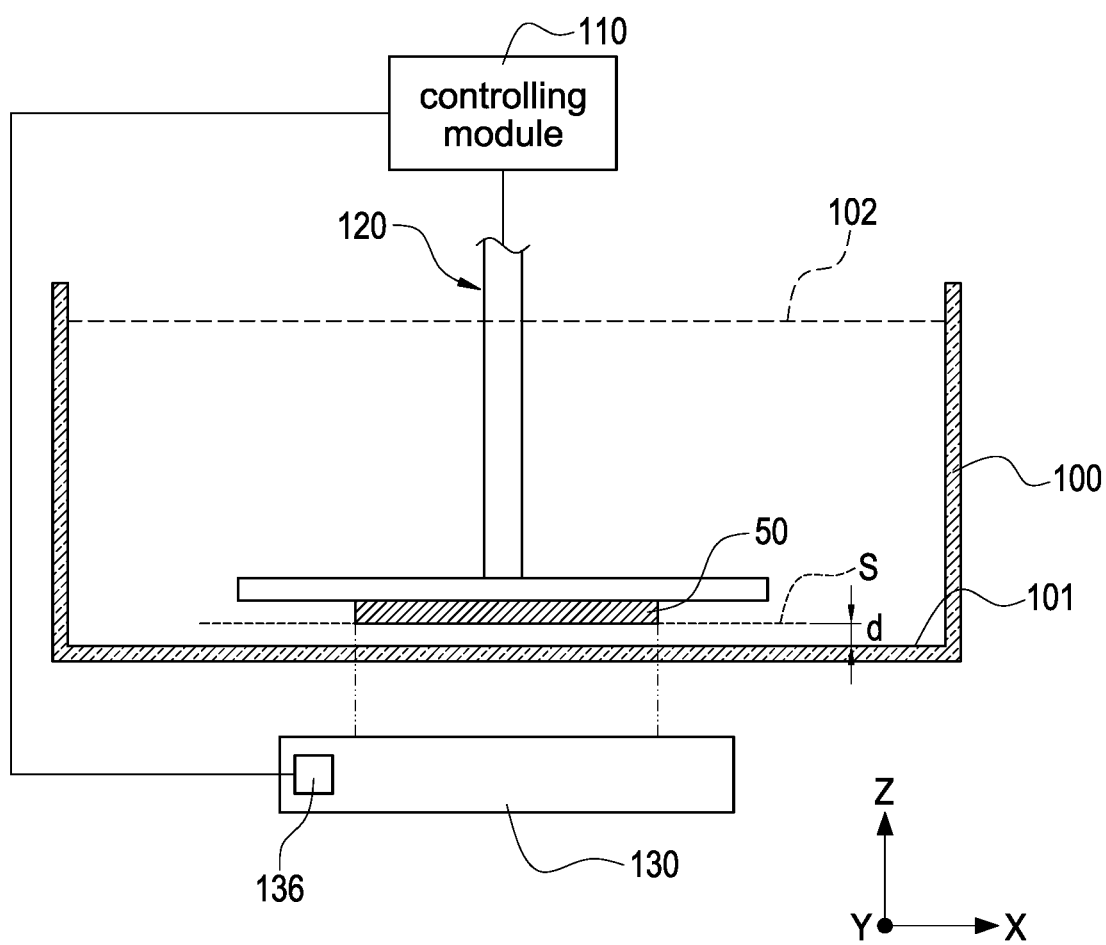
FIG. 3 depicts a schematic diagram illustrating a 3D printing system in accordance with an embodiment of the present disclosure.

Reference is made to FIG. 3, which depicts a schematic diagram illustrating a three-dimensional (3D) printing system in accordance with an embodiment of the present disclosure. The 3D printing apparatus 10 is a stereo lithography apparatus (SLA) for building physical 3D objects of 3D models (not shown) constitute by software. In FIG. 3, the 3D printing apparatus 10 includes a controlling module 110, a platform 120, and a lighting module 130. The controlling module 110 is in electrical communications with a computer apparatus (not shown), such as a notebook, a tablet, or a desktop; the computer apparatus may edit and process the 3D model and send a plurality of (quasi-two-dimensional) cross-sectional layer information related to the 3D model to the controlling module 110 of the 3D printing apparatus 10. The 3D printing apparatus 10 is adapted to build the physical 3D model by forming a plurality of thin (quasi-two-dimensional) cross-sectional layers which are built on one another in succession according to the cross-sectional layer information. Notably, the 3D model can be a digital 3D image file constructed by the computer apparatus via, for instance, computer-aided design (CAD) software, animation modeling software or the like; the computer apparatus 10 may further transform design information of 3D model constituted by the software into the cross-sectional layer information to form the (quasi-two-dimensional) cross-sectional layers 50, and the 3D object is formed by continuously stacking the (quasi-two-dimensional) cross-sectional layers 50

The platform 120 is positioned above the tank 100 and adapted to move in relative to the tank 100 along a Z axis. The tank 100 contains a liquid forming material 102; the platform 120 controlled by the controlling module 110 is adapted to immerse into or move out of the liquid forming material 102 filler within the tank 100. The liquid forming material 102 is, for example, a photosensitive resin and may sensitive to irradiation with specific wavelength (such as ultraviolet light).

The lighting module 130 is disposed below the tank 100 and adapted to emit and project light to the liquid forming material 102 for curing the liquid forming material 102. The light provided by the lighting module 130 passes through the tank 100 and irradiate the liquid forming material 102 between the platform 120 and an inner surface 101 of the bottom of the tank 100, so as to cure the irradiated liquid forming liquid 102 on the (bearing surface of the) platform 120. Specifically, the light generated from the lighting module 130 may be controlled to project onto a focus surface S away from the inner surface 101 with a predetermined distance S for curing the liquid forming material 102, so as to prevent the hardness difference between interior and exterior of the cross-sectional layer 50.

Figure 4:
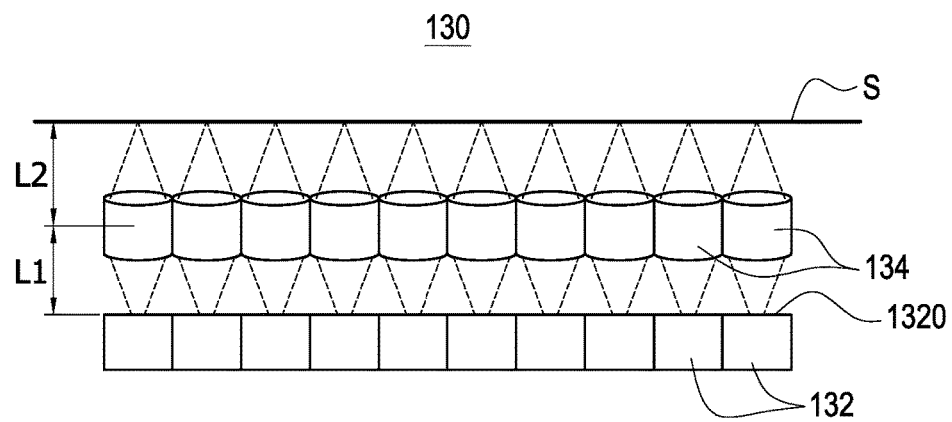
FIG. 4 is a partially enlarged view of a lighting module in accordance with the embodiment of the present disclosure.

The lighting module 130 coupled to the controlling module 110 is controlled by the controlling module 110. In detail, the lighting module 130 receives the signals generated by the controlling unit 110 and then emits light focused onto the focus plane S accordingly. In the present disclosure, the lighting module 130 may include a plurality of light emitting diodes (LEDs) 132, a plurality of light shaping components 134, and a driving unit 136, as shown in FIG. 4. Each LED 132 is used for generating divergent light with sector-shaped profile. Each light shaping component 134 is arranged between one of the LEDs 132 and the focus plane S, so that the divergent light from respective LED 132 is shaped by the corresponding light shaping component 134 and focused onto the focus surface S.

Notably, in the process of forming the 3D object through layer by layer stacking, if the light provided by the lighting module 140 is a planar light, then a planar cross-sectional layer 50 of the 3D object is entirely formed in each (scanning) procedure; in this case, the 3D printing system 10 may not require additional movable mechanism for moving the lighting module 130 to irradiate the liquid forming material 102 in different positions. However, if the light provided by the lighting module 130 is a linear light, then only a portion of the planar cross-sectional layer 50 (e.g., one row or one column of the planar cross-sectional layer 50) is cured after being irradiated by the linear light; therefore, additional movable mechanism (not shown) is required for the 3D printing system 10 to move the lighting module 130 along X and/or Y axis to irradiate the liquid forming material 102, so as to cure the irradiated liquid forming material 102, thereby forming the planar cross-sectional layer 50 on the (bearing surface of) the platform 120.

An amount of the light shaping components 134 is equal to that of the LEDs 132; each LED 132 and respective light shaping component 134 are adapted to provide light to irradiate (and cure) the liquid forming material 102 corresponding to one pixel of the cross-sectional information.

The light shaping component 134 may be a focus lens or a rod lens. In FIG. 4, the distance L1 between the center of the light shaping components 134 and light emitting surfaces of the LED 132 may be equal to the distance L2 between the center of the light shaping component 134 and the focus surface S; therefore, the height of the lighting module 130 can be effectively reduced to lower the shipping expense of the 3D printing system 10.

The driving unit 136 receives the controlling signal from the controlling module 110 and is configured to convert the controlling signal into data readable by the LEDs 132 and control the relative amount of the LEDs 132 that are on according to the 3D printing information from the computer apparatus in each (scanning) procedure.

Due to finite manufacturing process tolerance, the LEDs 132 of the light module 130 receives the same controlling signal may have different brightness, which may affect the uniformity of light projected to the focus surface S, so as to affect the quality of the cross-sectional layer 50. Specifically, at the position with high brightness, the liquid forming material 102 is well cured in a preset time; on the contrary, in the position with low brightness, the liquid forming material 102 may not successfully cured in the preset time or the hardness of irradiated liquid forming material 102 is at the position with low brightness is less than that of at the position with high brightness. In short, if brightness of the light provided by the lighting module 130 is uneven, then the formed cross-sectional layer 50 is likely to have different hardness.

Figure 5:
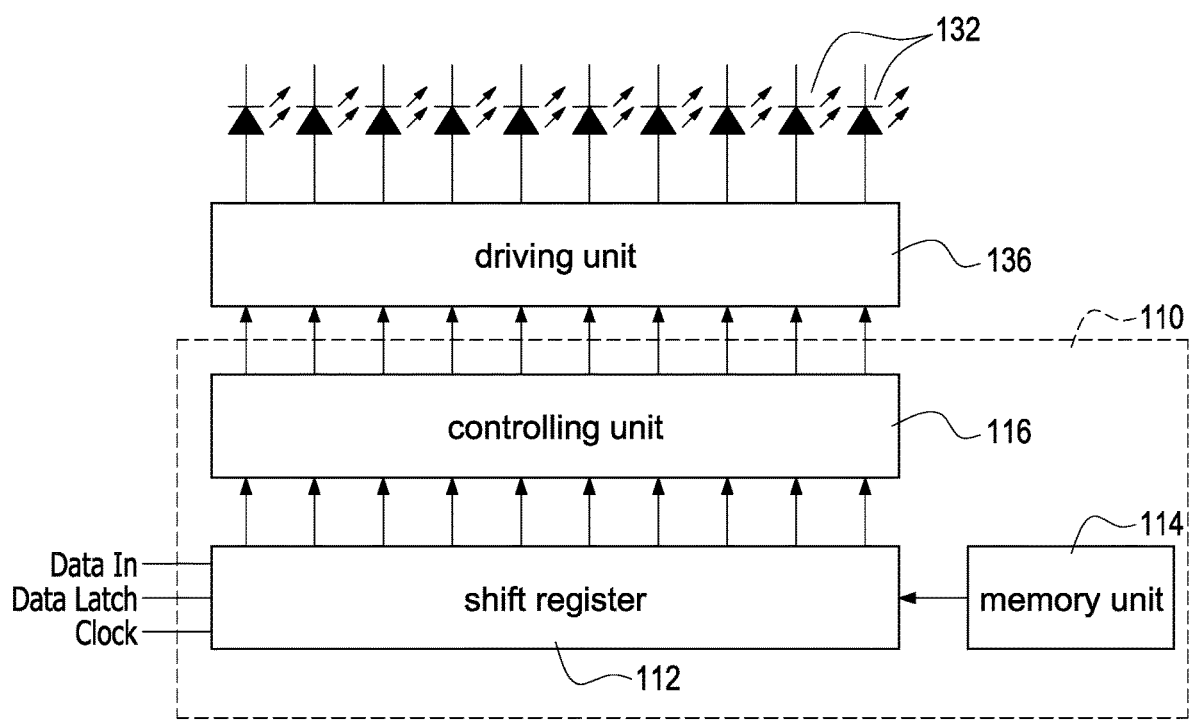
FIG. 5 is a circuit block diagram of a section of a controlling module in accordance with the embodiment of the present disclosure.

The partial circuit of the controlling module 110 shown in FIG. 5 is configured to vary the brightness of each LED 132, so as to prevent unevenness of brightness from affecting the forming quality of the 3D object. FIG. 5 depicts a circuit block diagram of a section of the controlling module in accordance with the embodiment of the present disclosure. For sake of convenient explanation, FIG. 5 also illustrates the LEDs 132 and the driving unit 136; the controlling module 110 includes a shift register 112, a memory unit 114, and a controlling unit 116; to avoid using to many input ports, the shift register 112 is designed to be a series shift register. The memory unit 114 is an electrically-erasable programmable read-only memory (EEPROM) for storing maximum brightness data of each LED 132.

The controlling module 110 can receive at least one illuminant series signal, at least one latch signal, and at least one clock signal involved in the 3D printing information provided by the computer apparatus and the maximum brightness information from the memory unit 114 and configured to generate at least one controlling signal to the driving unit 136; the driving unit 136 uses the controlling signal as a basis for generating a driving signal to drive the LEDs 132.

The illuminant series signal may be input to the controlling module 110 through the data input port Data In, the latch signal may enter the controlling module 110 through the data latch port Data Latch, and the clock signal may enter the controlling module 110 through the timing port Clock; the illuminant series signals is input in serial to the controlling module 110 in a serial manner. The shift register 112 may further receive maximum brightness data store within the memory unit 114.

As previously described, the illuminant series signal is input in serial to the controlling module 110, therefore the illuminant serial signal is completely received by the shift register 112 after the time of N clocks when the date input port Data In of the serial shift register 112 receives the illuminant serial signal corresponding to each (scanning) procedure. In detail, after the time of one clock, one bit of the illuminant series signal may be input to the shift register 112. If N bit illuminant series signal needs to be input to the shift register 112, the time of N clocks is required. Therefore, the latch signal is used for latching the illuminant series signal after predetermined cycle of the clock signal elapses to generate a switching signal for the LEDs 132 in each (scanning) procedure. The controlling unit 116 then uses the switching signal and the maximum brightness data as the basis for generating the controlling signal required for each LED 132 in different (scanning) procedures to the driving unit 136.

Notably, the controlling signal provided by the controlling unit 116 may be a pulse width modulating (PWM) signal; in this case, the controlling unit 116 may vary the duty cycle of the controlling signal for controlling the relative amount of time that the LEDs 132 are on, so that the liquid forming material 102 respective to each pixel may receive the same energy and each cross-sectional layer 50 may have similar curing hardness. For example, the controlling unit 116 is configured to modulate the PWM signal for the LED 132 with the highest maximum brightness of the LEDs 132 to have a maximum duty cycle (e.g., the duty cycle of 100%), and lower the duty cycles of the PWM signals for the other LEDs 132 to make sure that the irradiated liquid forming material 102 can have similar curing hardness.

Besides, the controlling unit 116 may also vary the brightness of the LEDs 132 by regulating the energy (e.g., current) conducted to the LEDs 132 to make sure that the irradiated liquid forming material 102 corresponding to each pixel can have similar curing hardness. For example, the controlling unit 116 is configured to make the current conducted to the LED 132 with lowest maximum brightness of the LEDs 132 be a maximum current, and lower the currents conducted to the other LEDs 132 to make sure that the irradiated liquid forming material 102 can have similar curing hardness.

Although the present disclosure has been described with reference to the foregoing preferred embodiment, it will be understood that the disclosure is not limited to the details thereof. Various equivalent variations and modifications can still occur to those skilled in this art in view of the teachings of the present disclosure. Thus, all such variations and equivalent modifications are also embraced within the scope of the disclosure as defined in the appended claims.

What is claimed is:

1. A three-dimensional printing system, comprising:
a tank filled with a liquid forming material;
a platform movably positioned above the tank and adapted to immerse into the liquid forming material filler within the tank;
a lighting module disposed below the tank and used for projecting light toward the liquid forming material, wherein the lighting module comprises a plurality of light emitting diodes (LEDs);
a controlling module coupled to the lighting module, wherein the controlling module is configured to drive the lighting module to generate light that is focused onto a focus plane between the platform and the tank and away from a bottom of the tank with a predetermined distance for irradiating the liquid material, so that the liquid forming material is cured to form a cross-sectional layer, wherein the controlling module uses the brightness of one of the LEDs as a basis for varying the brightness of the other LEDs, so that the liquid forming material cured in each procedure has similar hardness;

wherein a controlling signal provided by a controlling unit of the controlling module is a pulse width modulating signal, the controlling unit provides different on-times for each of the plurality of LEDs that with different maximum brightness by varying duty cycles of the pulse width modulating signal within the control signal; the control unit outputs the control signal including a plurality of duty cycles at the same time so that each of the plurality of LEDs outputs the same brightness, and the liquid forming material respective to each pixel receive the same energy and has same curing hardness, and then each of the cross-sectional layers has similar curing hardness; and wherein the lighting module further comprises a plurality of focus lenses or rod lenses arranged in between the focus plane and the LEDs for focusing light generated by the LEDs onto the focus plane so that a divergent light from one of the LEDs is shaped by one of the focused lens or rod lenses and focused onto the focus surface; an amount of the focus lenses or rod lenses is equal to that of the LEDs and each focus lens or rod lens is arranged with respect to each LED, and a first distance between centers of the focus lenses or rod lenses and light emitting surfaces of the LEDs is equal to a second distance between the centers of the focus lenses or rod lenses and the focus surface, therefore a height of the lighting module is effectively reduced to lower a shipping expense of the three-dimensional printing system.

2. The system of claim 1, wherein the controlling module comprises:
a memory unit configured to store brightness information of each LED; and
a shift register receiving an illuminant series signal;
wherein the controlling unit coupled to the memory unit and the shift register, the controlling unit generates a controlling signal for controlling each LED in accordance with the illuminant series signal and the brightness information of the LED.

3. The system of claim 2, wherein shift register further receives a latch signal and a clock signal and then generates a switching signal for each LED in each procedure according to the illuminant signal, the latch signal, and the clock signal, and the controlling unit uses the switching signal and the brightness information as a basis for generating the controlling signal for each LED.

4. The system of claim 2, wherein the memory unit is an electrically-erasable programmable read-only memory (EE-PROM).

5. The system of claim 1, wherein the controlling module further coupled to the platform and configured to control the platform to move out of the liquid forming material filler within the tank, so that at least one cross-sectional layer is cured and stacked on the platform.

* * * * *